(12) United States Patent
Shigemura

(10) Patent No.: US 7,537,798 B2
(45) Date of Patent: May 26, 2009

(54) DEPOSITION MASK FRAME ASSEMBLY, METHOD OF FABRICATING THE SAME, AND METHOD OF FABRICATING ORGANIC ELECTROLUMINESCENT DEVICE USING THE DEPOSITION MASK FRAME ASSEMBLY

(75) Inventor: Koji Shigemura, Sagamihara (JP)

(73) Assignee: Samsung Mobile Display Co., Ltd., Yongin-City (KR)

( * ) Notice: Subject to any disclaimer, the term of this patent is extended or adjusted under 35 U.S.C. 154(b) by 217 days.

(21) Appl. No.: 10/717,571

(22) Filed: Nov. 21, 2003

(65) Prior Publication Data

US 2004/0115342 A1    Jun. 17, 2004

(30) Foreign Application Priority Data

Nov. 22, 2002    (JP) .............................. 2002-339616

(51) Int. Cl.
*B05D 5/06* (2006.01)
(52) U.S. Cl. .......................... 427/66; 427/282; 118/721
(58) Field of Classification Search ................... 427/66, 427/68, 282; 118/720, 721
See application file for complete search history.

(56) References Cited

U.S. PATENT DOCUMENTS

| | | | | |
|---|---|---|---|---|
| 4,676,193 A | * | 6/1987 | Martin ........................ | 118/720 |
| 5,652,067 A | * | 7/1997 | Ito et al. ..................... | 428/690 |
| 2001/0019807 A1 | * | 9/2001 | Yamada et al. .............. | 430/139 |
| 2002/0025406 A1 | * | 2/2002 | Kitazume ................... | 428/136 |
| 2002/0102754 A1 | * | 8/2002 | Fujimori et al. ............. | 438/22 |
| 2002/0150674 A1 | * | 10/2002 | Utsugi et al. ................ | 427/58 |

FOREIGN PATENT DOCUMENTS

| | | |
|---|---|---|
| JP | 61-57903 | 12/1986 |
| JP | 10-121241 | 5/1998 |
| JP | 10-330910 | 12/1998 |
| JP | 2000-48954 | 2/2000 |
| JP | 2000-173769 | 6/2000 |
| JP | 2001-110567 | 4/2001 |
| JP | 2001-203079 | 7/2001 |
| JP | 2001-247961 | 9/2001 |
| JP | 2001-254169 | 9/2001 |
| JP | 2001-273979 | 10/2001 |
| JP | 2002-8859 | 1/2002 |
| JP | 2002-9098 | 1/2002 |

(Continued)

OTHER PUBLICATIONS

English translation of WO 03/019988.*

(Continued)

*Primary Examiner*—Frederick J Parker
*Assistant Examiner*—Jimmy Lin
(74) *Attorney, Agent, or Firm*—Stein McEwen, LLP

(57) ABSTRACT

A deposition mask frame assembly, a method of manufacturing the same, and a method of manufacturing an organic electroluminescent (EL) device using the deposition mask frame assembly are provided. The deposition mask frame assembly includes a mask including a thin plate in which a predetermined pattern of apertures is formed, a frame supporting one surface of the mask so that the mask is tensed, and a cover mask supporting an opposite surface of the mask, wherein the cover mask corresponds to the frame.

6 Claims, 10 Drawing Sheets

FOREIGN PATENT DOCUMENTS

| | | |
|---|---|---|
| JP | 2003-68453 | 3/2003 |
| JP | 2003-68454 | 3/2003 |
| WO | WO 03/019988 * | 3/2003 |

OTHER PUBLICATIONS

English abstract of JP 58-31077 published on Feb. 23, 1983.

Japanese Office Action issued in Japanese Patent Application No. 2002-339616 on Jun. 2, 2006 (in Japanese).

Korean Registration Determination Certificate (Notice of Allowance) issued on Sep. 30, 2008, in Korean Application No. 2003-65402 (in Korean).

* cited by examiner

DEPOSITION MASK FRAME ASSEMBLY, METHOD OF FABRICATING THE SAME, AND METHOD OF FABRICATING ORGANIC ELECTROLUMINESCENT DEVICE USING THE DEPOSITION MASK FRAME ASSEMBLY

CROSS-REFERENCE TO RELATED APPLICATIONS

This application claims the benefit of Japanese Application No. 2002-339616, filed Nov. 22, 2002, in the Japanese Intellectual Property Office, the disclosure of which is incorporated herein by reference.

BACKGROUND OF THE INVENTION

1. Field of the Invention

The present invention relates to a deposition mask frame assembly, a method of fabricating the same, and a method of fabricating an organic electroluminescent (EL) device using the deposition mask frame assembly, and more, particularly, to a mask frame assembly for depositing a thin film that constitutes an organic EL device.

2. Description of the Related Art

EL devices, which are spontaneous light-emitting display devices, provide a wide viewing angle, a good contrast, and a high response speed. Accordingly, much attention has been recently paid to EL devices because they can be used as next-generation display devices.

EL devices are classified into inorganic EL devices or organic EL devices, depending on what material is used to form a light-emitting layer. Organic EL devices have a higher brightness and faster responsivity than inorganic EL devices, and can provide color display, so they are being actively developed of late.

Such organic EL devices include first electrodes formed in a predetermined pattern on a transparent insulating substrate, an organic film formed on the first electrodes by vacuum deposition, and second electrodes formed as a cathode electrode layer on the organic film such that the first and second electrodes cross each other.

In the manufacture of the organic EL devices having such a structure, the first electrodes are typically formed by patterning indium tin oxide (ITO) using a photolithographic method.

Such a photolithographic method can be used before an organic film is formed, but causes a problem when it is used after an organic film is formed. Because the organic film is very susceptible to damage from water, it must be thoroughly isolated from water while being fabricated, and even after the fabrication. Moreover, the photolithographic method includes an exposure to water during the peeling-off and etching of the resist, so it is not suitable for the organic film and the cathode electrode layer.

This problem is usually solved by vacuum-depositing an organic light emissive material for the organic film, and a material for the cathode electrode layer, using a patterned mask. In particular, the cathode electrode layer can be patterned using a cathode separator, which is a predetermined separation wall, but it is known that a vacuum deposition is the most appropriate method to pattern an organic film formed of a low molecular organic material.

A technique of patterning an organic film, which is a light-emitting layer, using a mask is very important in the manufacture of full-color organic EL devices.

Examples of conventional full-color organic EL device coloring methods include a three-color independent deposition method of independently depositing red (R), green (G), and blue (B) color pixels on a substrate, a color conversion method (CCM) of forming a color conversion layer on a light emissive surface using a blue light source, and a color filtering method which uses a white light source and a color filter. The three-color independent deposition method is very popular because of the simplicity of the procedure, and because it provides a high color purity and efficiency.

In the three-color independent deposition method, a highly accurate mask must be used to independently deposit R, G, and B color pixels on a substrate. In particular, a high accuracy of the positions of the deposited pixels, that is, a high accuracy of the widths of pattern apertures, is required, and a high accuracy of a total mask pitch is also required.

A mask 10 used to deposit an organic film or electrodes during the fabrication of an organic EL device is typically supported by a frame 20, so that the mask 10 is tensed as shown in FIG. 1. The mask 10 is comprised of a single metal thin plate 11 and masking pattern units 12, which allow a plurality of substrate units that constitute an organic EL device to be deposited on the metal thin plate 11.

Because the mask 10 is thinly formed and minutely patterned, some parts of it may droop if it is used without any treatment, preventing an accurate patterning. Accordingly, as shown in FIG. 1, an optimal tension is applied to the mask 10 to obtain a predetermined accuracy of a total pitch (Pt), and the tensed mask 10 is coupled to the mask frame 20. Upon the coupling, it is important to not change the Pt accuracy. The coupling of the mask 10 to the mask frame 20 can be achieved by various methods such as using an adhesive, by laser welding, or by resistance welding.

The mask 10 may be fabricated by etching or electro-forming.

In the manufacture of the mask 10 by etching, a photoresist layer having a pattern of slits is formed on a thin plate, or a film having a pattern of slits is attached to a thin plate, and then the resulting plate is etched.

However, as masks are enlarged and the pattern of the slits becomes fine, the mask forming method based on etching cannot equalize the tolerance of the width of the mask to the tolerance of the edges of the slits. In particular, when the mask 10 is manufactured by etching a thin plate, the thin plate may be over-etched or under-etched. In this case, the sizes of the slits may not be standardized.

On the other hand, the electro-forming method has a principle that a metal is deposited on a prototype to a desired thickness by the electrolysis of a metallic salt solution through an operation such as electrical plating, and then peeled off from the prototype to obtain a metal product having an uneven surface whose prominences and depressions are arranged opposite to those of the prototype. According to this principle, a mask is fabricated.

In the method of fabricating a mask by the electro-forming method, an alloy of nickel (Ni) and cobalt (Co) is used as the material of the mask. The use of the Ni—Co alloy increases the roughness of a fabricated surface and the accuracy of a slot pattern. On the other hand, because the Ni—Co alloy has a poor weldability, a crack may be generated in the mask when the Ni—Co alloy is welded into a frame. In other words, when cobalt is alloyed with another metal, its hardness and intensity increase, and accordingly its fragility increases, which helps a crack to be easily generated upon welding.

This crack generation can be seen from FIGS. 2A through 2C. Referring to FIG. 2A, when the mask 10 and the frame 20 are welded by a laser welder 21, a gap 14 is generated around a joint 13 by heat flexion. If the welding continues on the resultant structure having the gap 14 as shown in FIG. 2B, a crack 15 is generated as shown in FIG. 2C. Due to this crack generation, the tension which supports a mask partially decreases, and accordingly the accuracy of the total pitch of the mask varies. Thus, accurate patterning is impossible.

A mask that overcomes the problem of creeping of strips that form slits due to a thermal expansion of the mask is disclosed in Japanese Patent Publication No. 2001-247961.

The disclosed mask includes a mask portion and a screen portion. The mask portion is a deposition mask used to form a patterning film on a substrate by deposition, and has partitions for defining a plurality of first apertures. The screen portion has a plurality of second apertures smaller than the first apertures, and a magnetic material in which the second apertures are disposed on the first apertures of the mask portion.

Japanese Patent Publication No. 2001-273979 discloses the structure of a magnetic mask. Japanese Patent Publication No. 2001-254169 discloses a deposition mask frame assembly, in which a patterned mask masks a deposition area in a close adherence to a material to be deposited and has finer gaps and finer patterns incapable of supporting a predetermined size than the thickness of a frame. The fine patterns of the patterned mask are supported by fine ribs.

These disclosed masks are closely adhered to a material to be deposited because they are formed of a magnetic material. However, due to the limits of the mask materials, these masks still have fundamental problems, such as a poor welding quality, and a variation in the accuracy of a total pitch due to the poor welding.

Japanese Patent Publication No. 2002-9098 discloses a pattern forming apparatus for preventing a film pre-formed on a substrate from being damaged due to a partial coming-off of a mask from a frame due to a thermal expansion during deposition. The pattern forming apparatus includes a support which is formed to be larger than the mask and has a dent portion to seat the mask onto the dent portion. The user of the support prevents a mask from being bent in waves due to a thermal expansion during the formation of a film. Also, by forming a magnetic element on the side of the mask other than the side on which the support is formed, the magnetic element makes the mask closer to the substrate so that a space between the mask and the support is created. Thus, the space contributes to cooling the mask.

However, because the disclosed mask having slits is not firmly supported by the frame, the location of the mask cannot be accurately controlled, and the location of the mask may be changed during deposition.

Japanese Patent Publication No. 2002-8859 discloses a pattern forming apparatus for preventing a mask from being expanded by heat during the formation of a film, in which a liquid path is formed within a frame which supports the mask, and a cooling solution circulates within the liquid path. However, this disclosure also has a problem such as a change in the accuracy of a total pitch due to a poor welding of a mask and a frame.

Japanese Patent Publication Nos. 2000-48954, 2000-173769, 2001-203079, and 2001-110567 disclose a metal mask including supplementary lines to prevent drooping of a mask shield between the mask and a frame. These masks also have fundamental problems such as a poor welding quality due to the limits of the material of a mask.

SUMMARY OF THE INVENTION

The present invention provides a deposition mask frame assembly, a method of fabricating the same, and a method of fabricating an organic electroluminescent (EL) device using the deposition mask frame assembly.

Additional aspects and/or advantages of the invention will be set forth in part in the description which follows and, in part, will be obvious from the description, or may be learned by practice of the invention.

According to an aspect of the present invention, there is provided a deposition mask frame assembly comprising a mask comprising a thin plate in which a predetermined pattern of apertures is formed, a frame supporting one surface of the mask so that the mask is tensed, and a cover mask supporting an opposite surface of the mask, wherein the cover mask corresponds to the frame.

The mask may be formed of either nickel or an alloy of nickel and cobalt by electro-forming.

The mask, the frame, and the cover mask may be joined together by dot welding. The dot welding may be performed so that a welding pitch, which is an interval between welding dots, is 3 mm or less.

According to another aspect of the present invention, there is provided a method of manufacturing a deposition mask frame assembly. This method may include manufacturing a mask by electro-forming, and installing a frame on one surface of the mask and installing a cover mask on the other surface of the mask while the mask is being tensed, and welding the cover mask, the mask, and the frame.

Here, the mask may be electrodeposited of nickel or an alloy of nickel and cobalt.

According to still another aspect of the present invention, there is provided a method of manufacturing an organic EL device. In this method, a first electrode layer is formed in a predetermined pattern on an insulating substrate. Next, an organic film including at least a patterned emission layer is formed on the first electrode layer. Thereafter, a second electrode layer is formed in a predetermined pattern on the organic film. Then, the second electrode layer is sealed. Here, at least one of the organic film and the second electrode layer is deposited using a deposition mask frame assembly. The deposition mask assembly includes a mask including a thin plate in which a predetermined pattern of apertures is formed, a frame supporting one surface of the mask so that the mask is tensed, and a cover mask supporting an opposite surface of the mask, wherein the cover mask corresponds to the frame.

The mask may be formed of nickel or an alloy of nickel and cobalt by electro-forming.

The mask, the frame, and the cover mask may be joined together by dot welding. The dot welding may be performed such that a welding pitch, which is an interval between welding dots, is 3 mm or less.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
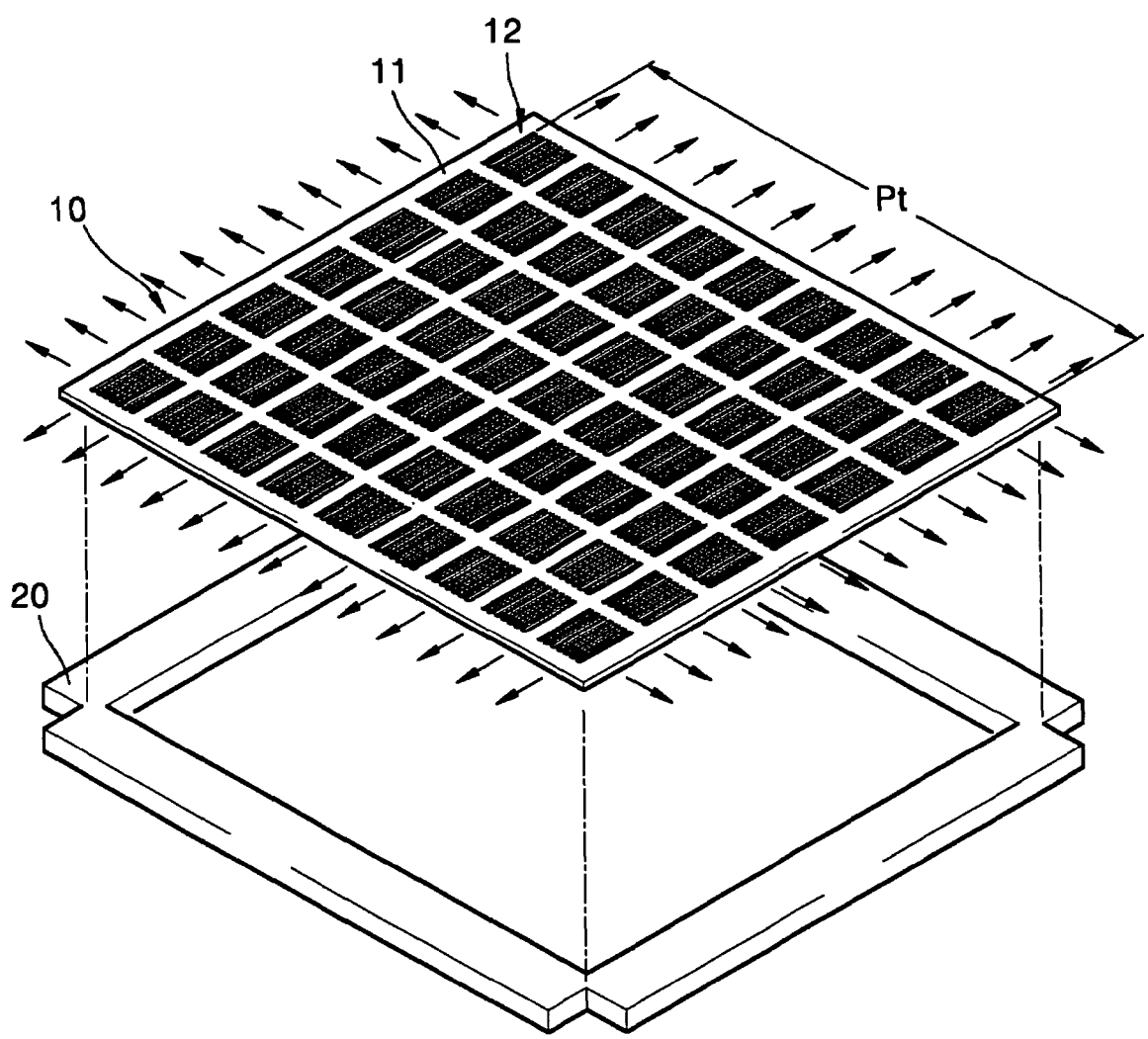
FIG. 1 is an exploded perspective view of a conventional mask frame assembly.
Figure 2A:
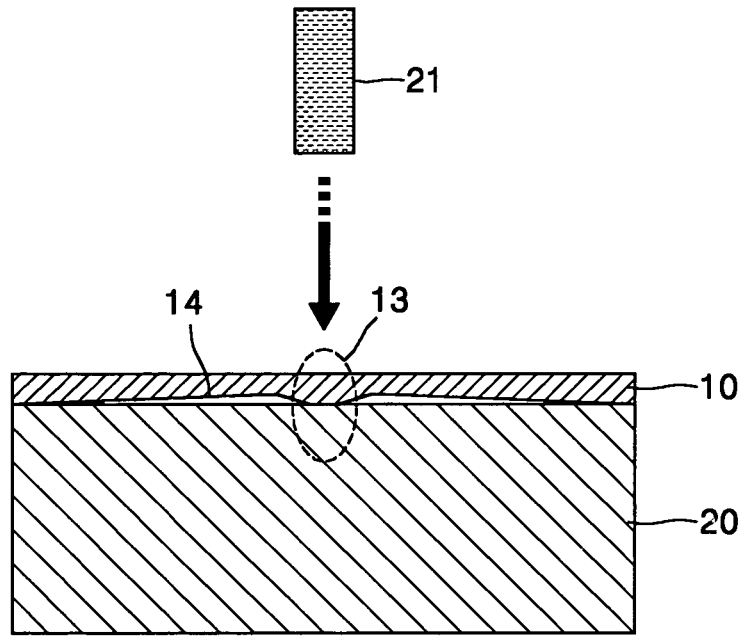
FIGS. 2A through 2C are cross-sectional views illustrating a process in which a crack is generated around a joint where a mask made of an alloy of nickel and cobalt joins to a frame.
Figure 2B:
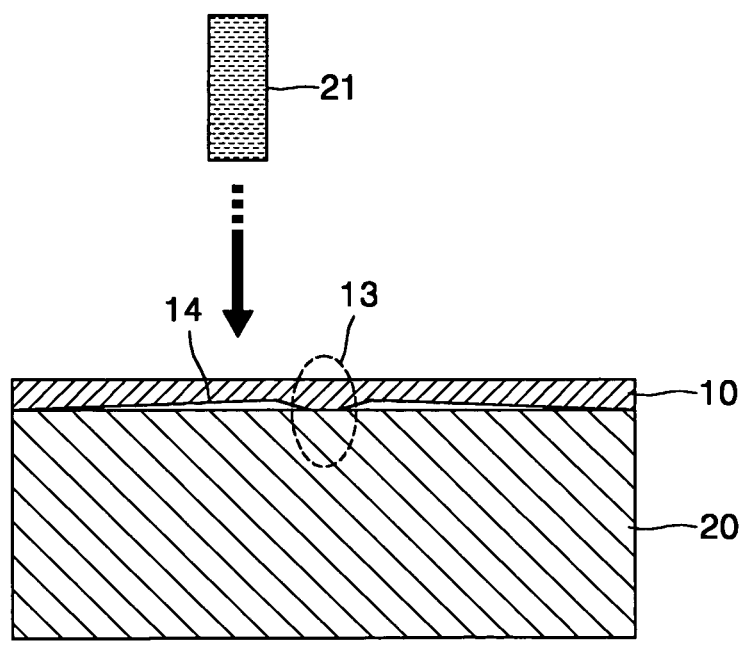
Figure 2C:
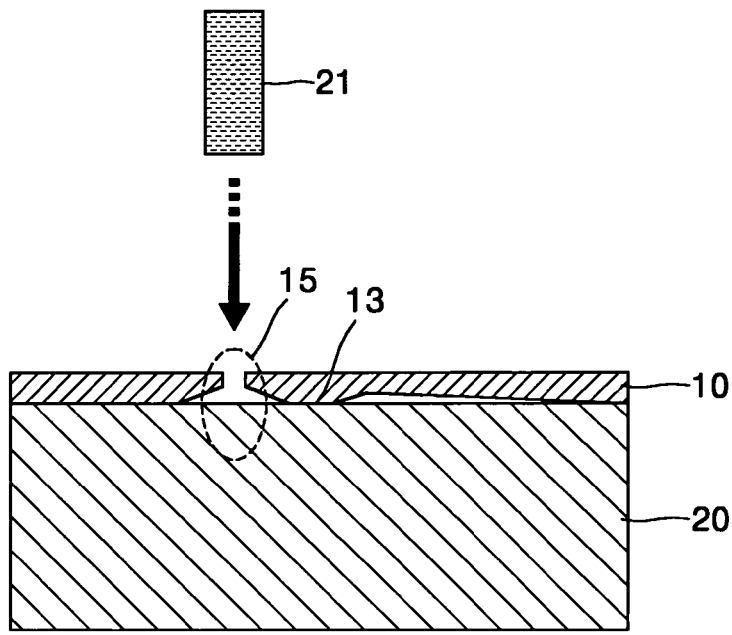

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 3:
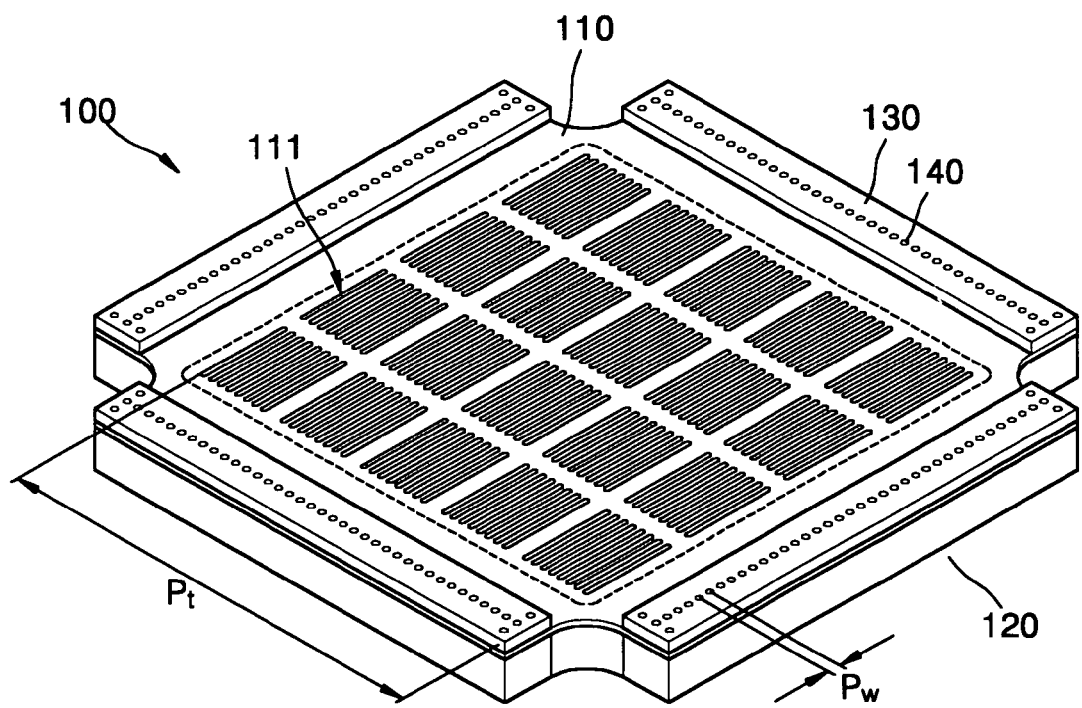
FIG. 3 is a perspective view of a mask frame assembly according to an embodiment of the present invention.

A mask frame assembly 100 according to an embodiment of the present invention will now be described with reference to FIGS. 3 through 5. Referring to FIG. 3, the mask frame assembly 100 includes a mask 110 having a plurality of mask units 111 and a frame 120 which supports the mask 110 so as to apply a tension to the mask 110. The frame 120 is hollow so as to support the edge of the mask 110 excluding the mask units 111.

Figure 4:
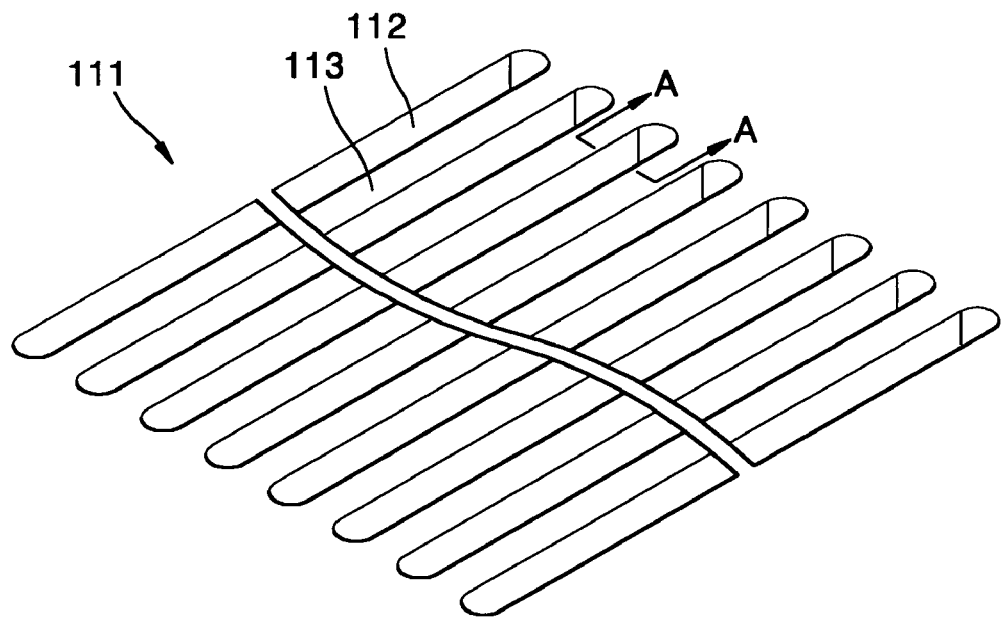
FIG. 4 is a partial perspective view of the mask of FIG. 3.

As shown in FIG. 4, the mask units 111 include a pattern of apertures 112 which are defined by shielding portions 113. As shown in FIG. 4, the apertures 112 may be formed in an elongated pattern, but they may also be formed in other patterns.

As shown in FIG. 3, the edge of one surface of the mask 110 is supported by the frame 120, while the edge of the opposite surface of the mask 110 is supported by a cover mask 130. The cover mask 130 is configured so as to support the four edges of the mask 120 in FIG. 3, but any configuration that can support the portion of the mask 110 supported by the frame 120 may be used.

The mask 110 may be made of either nickel or an alloy of nickel and cobalt. Preferably, the mask 110 may be made of the nickel-cobalt alloy, which facilitates the formation of fine patterns and provides an excellent surface roughness. The apertures 112 of the mask 110 are formed in a predetermined pattern by an electro-forming method so as to obtain a fine pattern and an excellent surface smoothness. The alloy of Ni and Co may be composed of 85% by weight nickel and 15% by weight cobalt. However, various composition ratios of Ni to Co may be applied.

The cover mask 130 may be formed of Invar, which is mainly composed of Fe and Ni, or 42 alloy, or stainless steel SUS304. Here, SUS denotes special use stainless steel of Japanese Industrial Standards. The frame 120 may be formed of stainless steel SUS410. Moreover, the cover mask 130 or the frame 120 may be formed of various materials.

As shown in FIG. 3, the mask 110, the cover mask 130, and the frame 120 are joined together in such a way that the mask 110 is located between the cover mask 130 and the frame 120. The joining may be achieved using an adhesive agent, preferably by welding. Various welding methods are available such as laser welding or resistance welding. When considering a change in accuracy after the joining, laser welding is preferable. Welding dots 140 of FIG. 3 denote dots used in dot welding using a laser. A welding pitch Pw is controlled depending on a change in the accuracy of a total pitch after the joining. Preferably, the welding pitch Pw is controlled to 3 mm or less, which will be described later in detail.

As described above, the deposition mask assembly 100 uses the mask 110 manufactured by electro-forming using nickel or a Ni—Co alloy, thus providing an accurate pattern and an excellent surface smoothness. In addition, the deposition mask assembly 100 prevents a crack due to heat refraction at the welding dots by employing the cover mask 130 attached to one side of the mask 110, thus preventing the total pitch from varying due to a poor welding, which is a weak point of the Ni—Co alloy.

Figure 5:
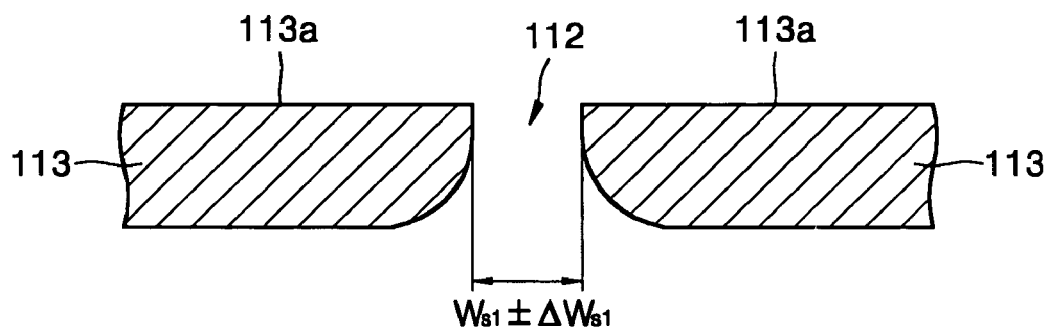
FIG. 5 is a cross-sectional view taken along line A-A of FIG. 4.

FIG. 5 is a cross-sectional view taken along line A-A of FIG. 4. in practice, a surface 113a of the individual shielding portions 113, which contacts a substrate on which a deposition is made, can have a surface smoothness of 0.1 μm. Each of the apertures 112 can have a width tolerance $\Delta Ws1$ of ±5 μm. The accuracy of the total pitch Pt can be ±10 μm.

Figure 6A:
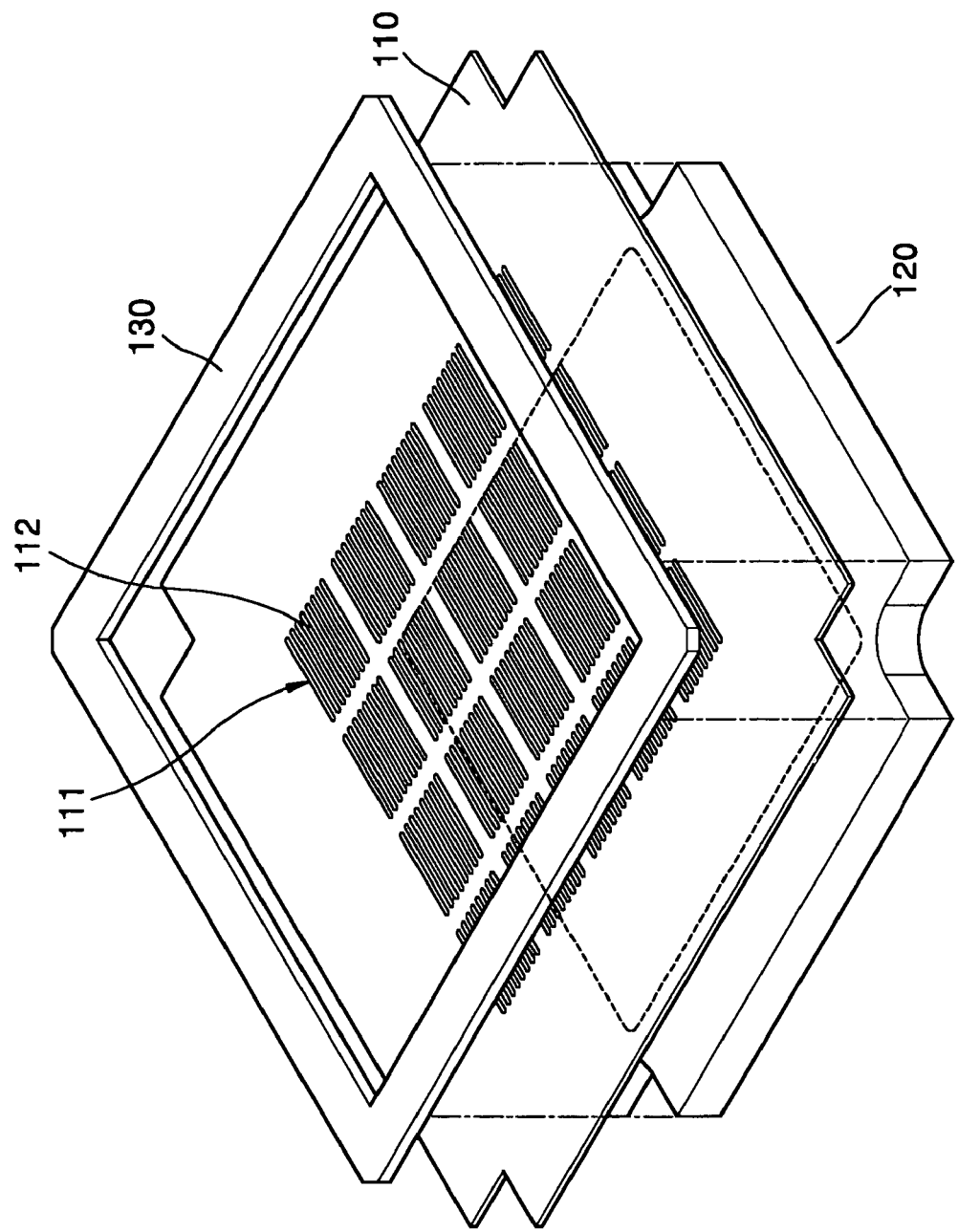
FIGS. 6A through 6C are perspective views illustrating a process of manufacturing a mask frame assembly according to an embodiment of the present invention.

A method of manufacturing a deposition mask frame assembly according to an embodiment of the present invention will now be described with reference to FIGS. 6A through 6C.

First, the mask 110 is manufactured by electro-forming. Although not shown in the drawings, a metal layer is electrodeposited on an exposed portion of an electrodepositing plate using an electro-forming method. Here, the electrodepositing plate has a film attached on its area corresponding to shielding portions that form the outer portion of the mask 110 and define the apertures 112. Preferably, the metal layer is formed of nickel or an alloy of nickel and cobalt. Although the metal layer can be electrodeposited to a thickness of about 30 to 50 μm, the thickness may vary according to the conditions of the user of the mask 110.

After the completion of the electrodeposition for manufacturing the mask 110, the mask 110 is separated from the electrodepositing plate. As shown in FIG. 6A, the mask 110 interposes between the frame 120 and the cover mask 130. Preferably, the inner circumference of the cover mask 130 is made larger than the outer circumference of a substrate (not shown) on which a film is to be deposited, in order to prevent a shadow effect which occurs during deposition when the cover mask 130 contacts the substrate due to a smaller inner circumference of the cover mask 130 than the outer circumference of the substrate.

Figure 6B:
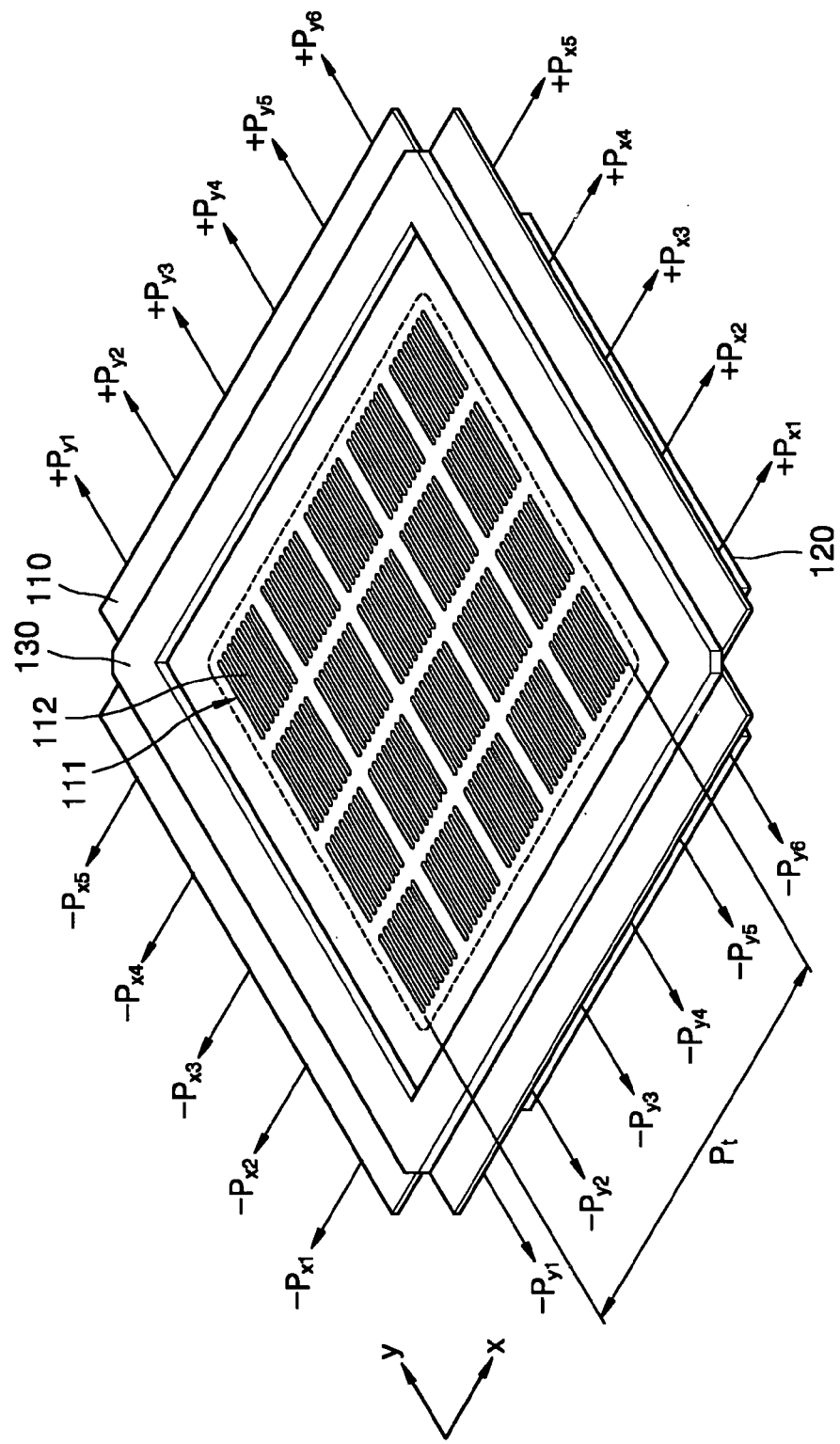
Figure 7A:
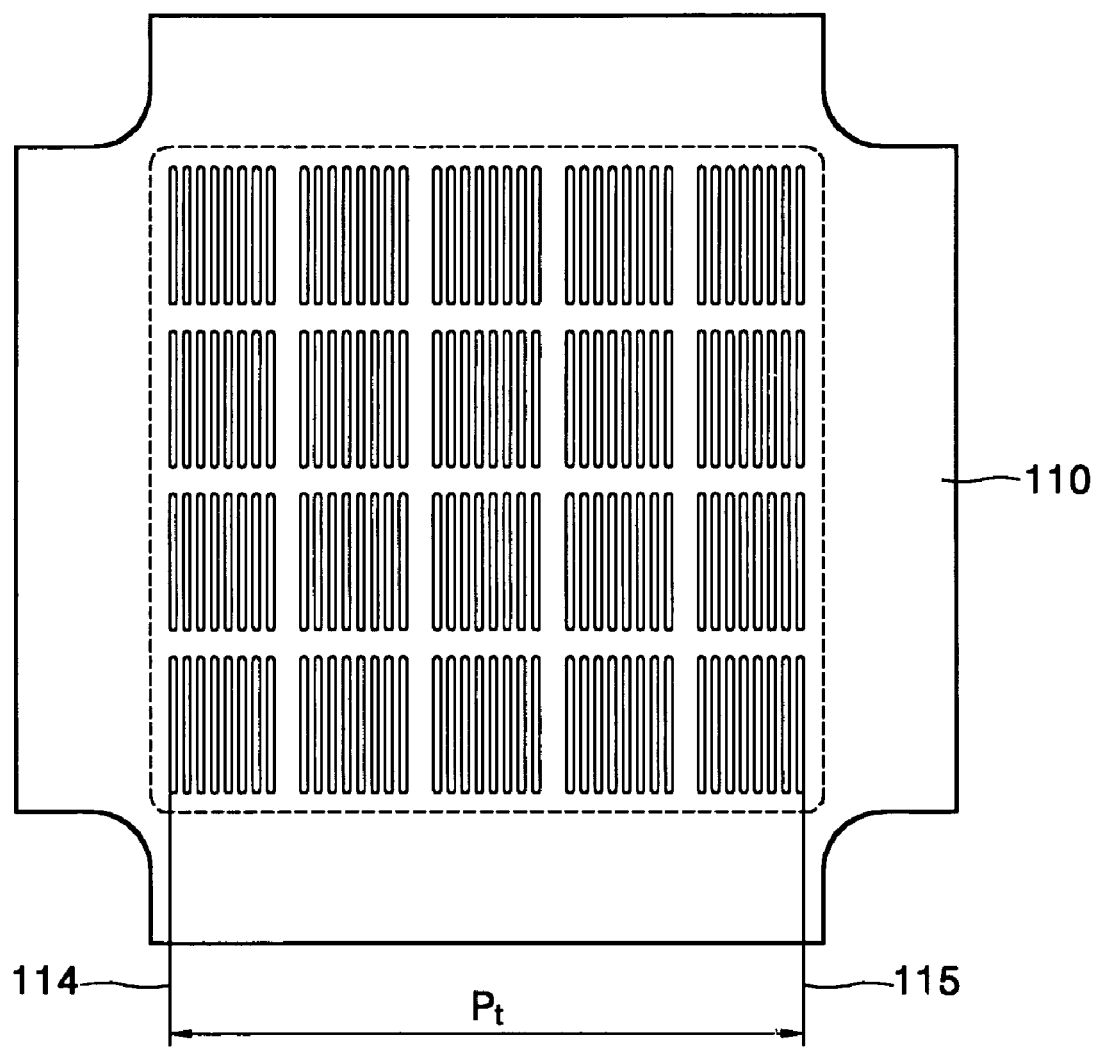
FIGS. 7A through 7D show a deviation of the total pitch of a mask frame assembly and a line deviation of the mask frame assembly.
Figure 7B:
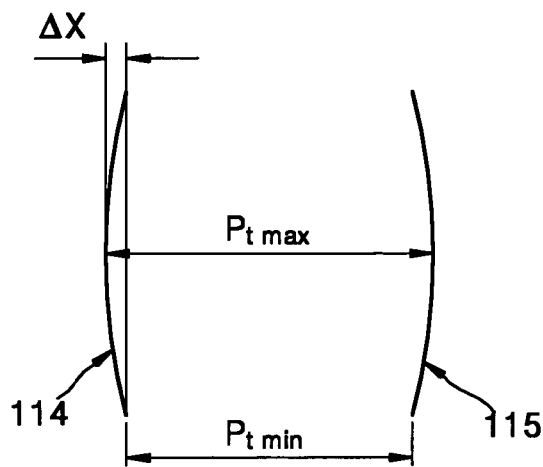
Figure 7C:
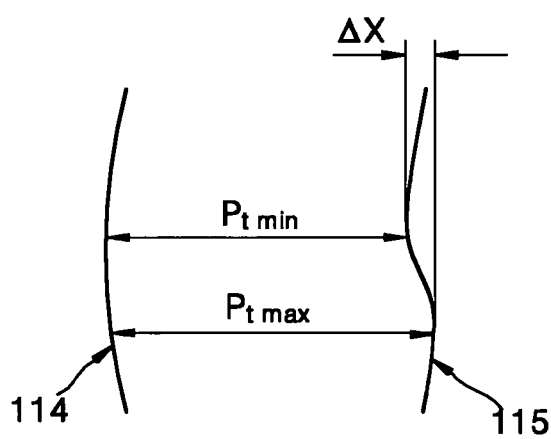
Figure 7D:
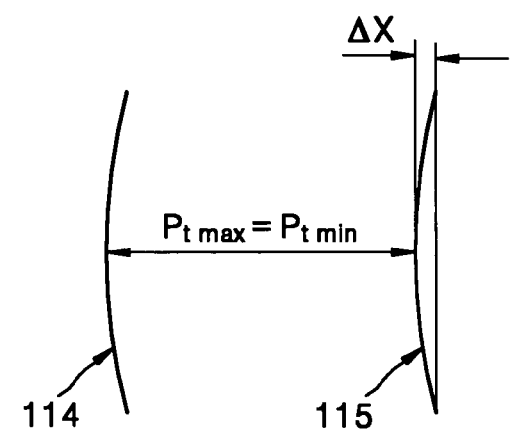

As shown in FIG. 6B, the mask 110 is clamped and subjected to a tension in directions x and y. Here, the same tension can be applied in directions x and y. However, it is preferable that the four sides are subjected to optimal tensions +Px1 to +Px5, −Px1 to −Px5, +Py1 to +Py6, and −Py1 to −Py6, respectively. In this case, as shown in FIG. 7A, there is no deviation because the total pitch Pt between two outermost lines 114 and 115 is uniform. As shown in FIGS. 7B and 7C, the total pitch Pt may have a deviation ($\Delta Pt = Ptmax - Ptmin$). As shown in FIGS. 7B through 7D, a line deviation ($\Delta X$) may occur. Consequently, the application of different tensions for different sides of the mask can reduce the deviation of the total pitch and the line deviation.

Figure 6C:
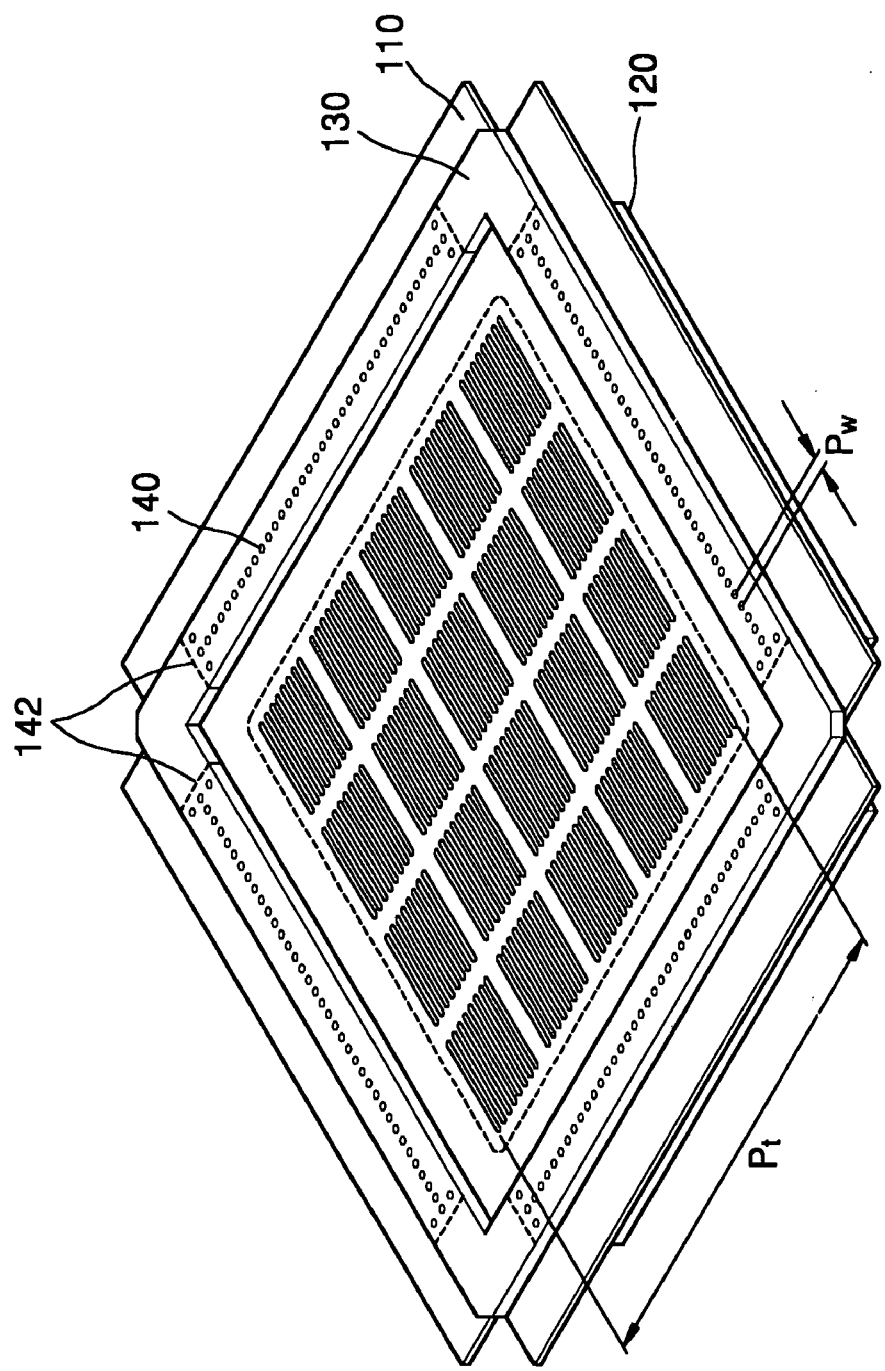
Figure 8:
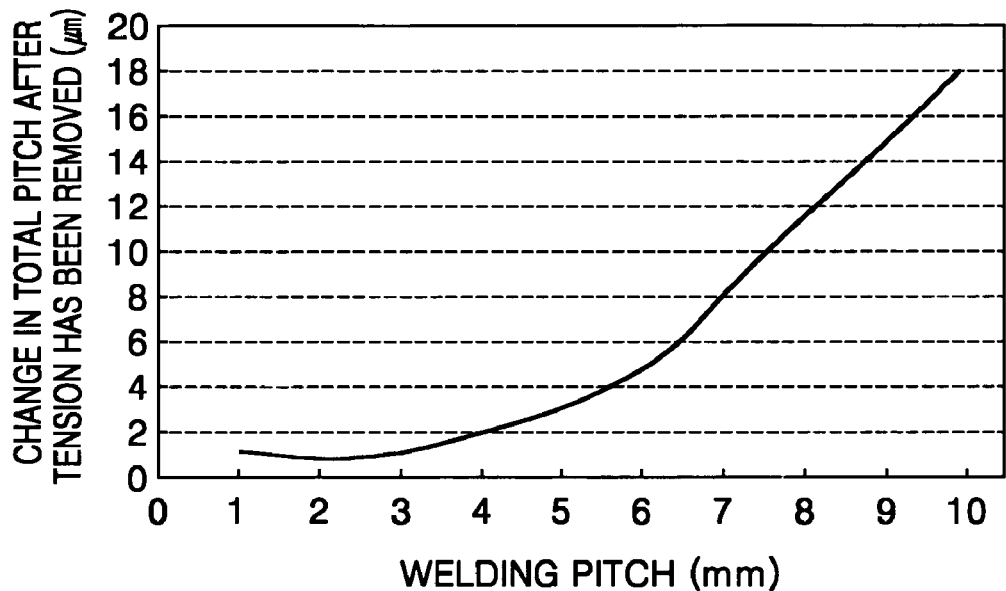
FIG. 8 is a graph of a total pitch after a tension is removed after welding versus a welding pitch.

As can be seen from FIG. 6C, while the mask 110 is being tensed, the mask 110, the cover mask 130, and the frame 120 are joined together. As described above, the joining can be accomplished by any method, such as an adhesion or welding. However, laser dot welding is preferable, when considering an accuracy change or the like caused after the joining. When determining the welding pitch Pw between the welding dots 140, a change in the accuracy of the total pitch obtained after tension is removed, after the joining, must be considered. The relationship between a change in the total pitch and a change in the welding pitch when the tension has been removed after welding is shown in FIG. 8. As can be seen from FIG. 8, a variation in the total pitch decreases as the welding pitch decreases, and the variation in the total pitch is very small at the welding pitches of 3 mm or less. Thus, it is preferable that the welding pitch Pw is 3 mm or less. Under this condition, even when a mask is made of a Ni—Co alloy, welding dots are supported by a cover mask and a frame respectively installed on the upper and lower surfaces of the mask, such that a transformation of the mask due to heat refraction is prevented. Consequently, generation of cracks is prevented.

After the above-described welding is completed, a portion 142 of the cover mask 130 and the edge of the mask 110 may be cut off so that the sizes and shapes of the cover mask 130 and the mask 110 match with those of the frame 120.

This mask frame assembly may be used to vacuum-deposit an organic film or a second electrode layer for an organic EL device. Hereinafter, a method of manufacturing an organic EL device using the mask frame assembly will be described.

First, a substrate whose size corresponds to the size of the mask frame assembly 100 of FIG. 3 is prepared, and a first electrode layer is formed of ITO or the like in a predetermined pattern. Here, one first electrode layer pattern has the same size as the size of a mask unit 111 of the mask frame assembly 100 of FIG. 3, and the number of first electrode layer patterns is equal to the number of mask units 111. The first electrode layer may be formed by any of conventional pattern forming methods, but usually formed by a photolithographic method.

After the first electrode layer patterns have been formed, an inter-insulator clearly partitioning the first electrode layer is formed of an insulating photosensitive material such as photoresist or polyimide. In some cases, a cathode separator partitioning a second electrode layer may be formed together with the inter-insulator.

Next, an organic film is deposited within a vacuum deposition device.

A depositing method depends on the type of an organic film to be deposited. Since a hole injection layer, a hole transport layer, an electron injection layer, or an electron transport layer is blanket-deposited without patterning, an open mask having no apertures is used instead of the deposition mask frame assembly of FIG. 3. An emission layer may be deposited using the deposition mask frame assembly of FIG. 3. These layers may be formed of any material that can form an organic film used in existing low-molecular organic EL devices, and are deposited in a sequence of the hole injection layer, the hole transport layer, the emissive layer, the electron transport layer, and the electron injection layer. Here, the structures of the deposited layers may be transformed into various structures.

After the completion of this organic film deposition, a second electrode layer serving as a cathode is deposited on the deposited organic film. The second electrode layer is patterned such that the second electrode layer patterns cross the first electrode layer patterns at approximately right angles, and may be formed of Al and/or Ca. The second electrode layer may be patterned by various methods, such as the above-described blanket deposition method using the open mask, or the deposition method using the deposition mask of FIG. 3.

After the deposition of the second electrode layer is completed, the second electrode layer is sealed with epoxy resin or a metal cap which contains a moisture absorbent, and a driving circuit is connected to a terminal exposed to the outside.

As described above, a mask frame assembly according to an embodiment of the present invention be used in the deposition of an organic film and the deposition of a second electrode layer.

The characteristics of an organic EL device manufactured using a mask frame assembly according to the present invention relative to an organic EL device using a conventional mask frame assembly are shown in Table 1. Table 1 shows different embodiments where an emission layer is deposited using a mask frame assembly according to the present invention.

In Table 1, the first through third embodiments show organic EL devices manufactured using a mask frame assembly according to embodiments of the present invention, in which a cover mask is added to a mask formed of an Ni—Co alloy by electro-forming. The first comparative example shows an organic EL device using a mask formed of an Ni—Co alloy by a conventional electro-forming method. The second through fourth comparative examples show organic EL devices using a mask manufactured by etching.

|  | First embodiment | Second embodiment | Third embodiment | First comparative example | Second comparative example | Third comparative example | Fourth comparative example |
|---|---|---|---|---|---|---|---|
| ΔPt | ±5 μm | ±5 μm | ±5 μm | ±10 μm | ±5 μm | ±5 μm | ±5 μm |
| ΔX | ±3 μm | ±3 μm | ±3 μm | ±5 μm | ±3 μm | ±3 μm | ±3 μm |
| ΔWs1 | ±5 μm | ±5 μm | ±5 μm | ±5 μm | ±10 μm | ±10 μm | ±10 μm |
| Pixel pitch | 130 ppi | 150 ppi | 100 ppi | 130 ppi | 130 ppi | 100 ppi | 100 ppi |
| Aperture efficiency | 60% | 55% | 69% | 60% | 60% | 69% | 58% |
| Luminance failure rate | 0% | 0% | 0% | 9% | 14% | 12% | 0% |
| Color mixture generation rate | 0% | 0% | 0% | 3% | 5% | 3% | 0% |
| Blind generation rate | 0% | 0% | 0% | 0% | 1.2% | 1.2% | 1.2% |
| Pixel short generation rate | 0% | 0% | 0% | 0% | 0.5% | 0.5% | 0.5% |

In Table 1, ΔPt denotes a deviation of a total pitch obtained after a tension has been removed after welding, ΔX denotes a line deviation, and ΔWs1 denotes a deviation of an aperture width. The luminance failure rate is caused when an organic emission film is incompletely deposited on a pixel area of the organic EL device. The color mixture generation rate denotes a case in which two organic emission films are overlapped on a single pixel, that is, a case in which color mixture occurs. Accordingly, the luminance failure rate and the color mixture generation rate indicate when apertures formed in a mask have not been accurately patterned. The blind generation rate denotes a value obtained by dividing a blind that occurs at the same area on different substrates by the number of assessed pixels. The pixel short generation rate denotes a value obtained by dividing a pixel short that occurs at the same area on different substrates by the number of assessed pixels.

As can be seen from Table 1, the first through third embodiments according to the present invention provide a significantly lower luminance failure rate and a significantly lower color mixture generation rate than those of the second through fourth comparative examples in which a mask frame assembly manufactured by an existing etching method is used. Also, it can be seen from Table 1 that the present invention prevents generation of a blind or a pixel short.

Furthermore, the first through third embodiments of the present invention provide a lower luminance failure rate and a lower color mixture generation rate than those of the first comparative example in which a mask frame assembly manufactured by an existing electro-forming method is used. This is because in the first comparative example, a patterning failure occurs due to a degradation of the weldability of an Ni—Co alloy used to manufacture a mask of the mask frame assembly in the first comparative example.

Figure 9:
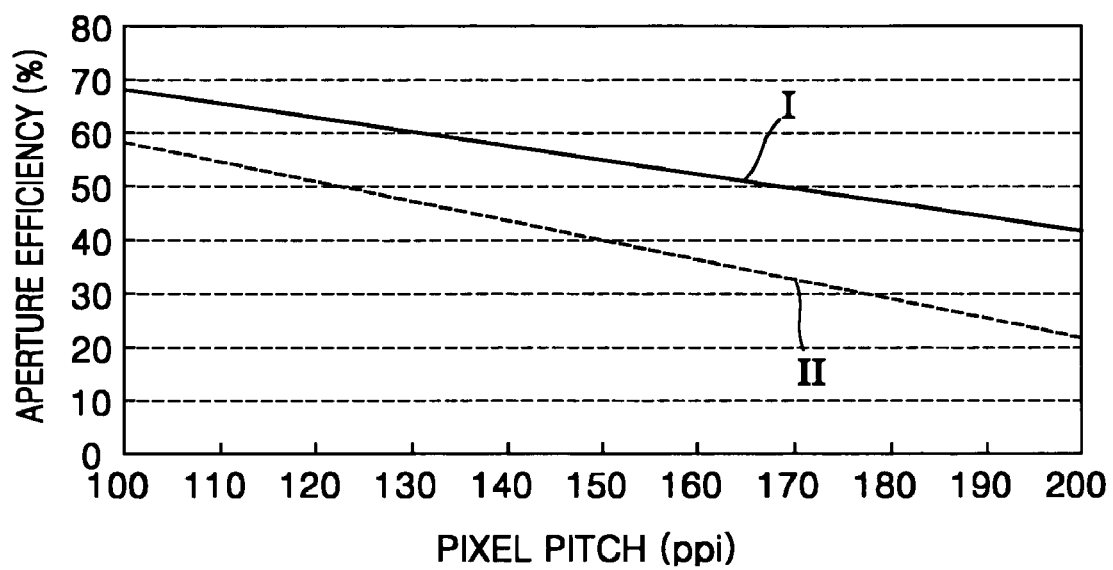
FIG. 9 is a graph of an aperture efficiency based on a deviation of the widths of apertures of a mask versus a pixel pitch.

FIG. 9 is a graph of an aperture efficiency versus a pixel pitch in cases I and II where a deviation (ΔWs1) of the widths of apertures of a mask is ±5 μm and ±10 μm, respectively. The first through third embodiments of the present invention and the first comparative example in Table 1 correspond to the case I, and the second through fourth comparative examples in Table 1 correspond to the case II. As shown in FIG. 9, the present invention provides an aperture efficiency of 50% or greater even when pixels are made small enough to achieve a pixel pitch of 170 ppi. Thus, the use of a deposition mask frame assembly according to the present invention enables a user to obtain a full-color organic EL device of a high quality.

Also, in a case in which a deposition mask is manufactured by electro-forming, shielding portions which define apertures may have a rectangular shape, thus reducing a shadow effect which occurs during deposition.

A deposition mask frame assembly according to the present invention, a method of manufacturing the same, and a method of manufacturing an organic EL device using the same provide the following effects. Firstly, generation of cracks due to welding of a mask and a frame is minimized, and transformation of the mask is also minimized.

Secondly, a welding failure can be minimized even when the mask is formed of an Ni—Co alloy, and the accuracy of the widths of apertures, the accuracy of a total pitch, and a surface smoothness can be increased simultaneously.

Thirdly, the deposition failure rate of pixels is lowered, such that generation of a luminance failure and a color mixture can be reduced.

Fourthly, pixels can be highly miniaturized with a high aperture efficiency, and an organic film or other electrodes can be deposited with a low loss. Thus, generation of a blind and a pixel short can be reduced.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of manufacturing an organic EL device, the method comprising:
    forming a first electrode layer in a predetermined pattern on an insulating substrate;
    forming an organic film comprising at least a patterned emission layer on the first electrode layer; and
    forming a second electrode layer in a predetermined pattern on the organic film;
    wherein the organic film and/or the second electrode layer are/is deposited using a deposition mask frame assembly, the deposition mask frame assembly comprising:
        a flat mask comprising a flat thin plate in which a predetermined pattern of apertures is formed, the flat mask having a first flat surface extending over an entire area of the flat mask, and a second flat surface extending over the entire area of the flat mask, the second flat surface being separated from the first flat surface by a thickness of the mask;
        a flat frame supporting the first flat surface of the flat mask so that the flat mask is tensed and the first flat surface remains flat; and
        a flat cover mask supporting the second flat surface of the flat mask so that the second flat surface remains flat; and
    wherein the flat mask, the flat frame, and the flat cover mask are held together by welds.

2. The method of claim 1, wherein the flat mask is formed of nickel or an alloy of nickel and cobalt.

3. The method of claim. 1, wherein the flat mask is a flat electro-formed mask.

4. The method of claim 1, wherein the welds are dot welds.

5. The method of claim 4, wherein a welding pitch between the dot welds is 3 mm or less.

6. The method of claim 1, wherein the flat mask is tensed with different tensions at different points on each of a plurality of sides of the flat mask.

* * * * *